United States Patent [19]

Buck

[11] 4,135,124
[45] Jan. 16, 1979

[54] ELECTRONIC MONITORING SYSTEM WITH SELECTIVE SIGNAL INVERTER

[76] Inventor: Robert Buck, Kirchbühlweg 128, 7995 Neukirch, Germany

[21] Appl. No.: 808,372

[22] Filed: Jun. 20, 1977

[30] Foreign Application Priority Data

Jun. 24, 1976 [DE] Fed. Rep. of Germany ....... 2628427

[51] Int. Cl.² ........................................... H01H 36/00
[52] U.S. Cl. .................................. 323/19; 307/252 P; 323/22 SC; 328/5; 361/180
[58] Field of Search ............ 307/252 A, 252 J, 252 P, 307/252 W; 323/19, 22 SC; 328/5; 331/65; 361/180

[56] References Cited

U.S. PATENT DOCUMENTS

| | | | |
|---|---|---|---|
| 3,743,865 | 7/1973 | Riechmann | 328/5 X |
| 3,932,774 | 1/1976 | Buck | 361/180 X |

OTHER PUBLICATIONS

Ernst et al., "Heater Control Circuit", IBMTDB, vol. 15, No. 5, Oct. 1972, p. 1587.

Primary Examiner—A. D. Pellinen
Attorney, Agent, or Firm—Karl F. Ross

[57] ABSTRACT

A contactless motion detector is energized from a source of direct current via a pair of supply leads and delivers an output signal by way of a further conductor to a control electrode of a binary electronic switch, such as a thyristor, in series with the source and a load to modify the flow of load current upon the approach of a metallic element, for example. An Exclusive-OR gate is inserted in the further conductor to act as a selective signal inverter, one input of this gate being permanently connected to one supply lead while being also selectively connectable to the other supply lead whereby the load current can be either increased or reduced upon the occurrence of the event to be detected.

5 Claims, 3 Drawing Figures

ELECTRONIC MONITORING SYSTEM WITH SELECTIVE SIGNAL INVERTER

FIELD OF THE INVENTION

My present invention relates to an electronic monitoring system, as used for example in a proximity sensor, wherein a preferably contactless detector, sensitive to an ambient condition, generates a binary output signal which assumes a predetermined value (representing either a logical "one" or a logical "zero") in response to a significant change in that condition, e.g. with the approach of a metallic element, to increase (or decrease) the current flow through a load designed to indicate such change.

BACKGROUND OF THE INVENTION

Such a monitoring system has been described in my prior U.S. Pat. Nos. 3,747,010, 3,747,011, 3,747,012, 3,919,661, 3,932,774, 3,932,803 and 3,935,542. As particularly disclosed in U.S. Pat. Nos. 3,932,803 and 3,935,542, for example, the contactless motion detector may comprise an oscillator and an associated trigger amplifier whose energizing circuit includes a storage capacitor which is charged via a two-conductor supply network from a source of pulsating direct current by way of a current-limiting device, such as a constant-current unit or a simple resistor, shunted by an electronic switch such as thyristor. A control input of that switch, thus the gate electrode of the thyristor, is connected to a lead carrying the output signal of the detector, preferably after amplification of that signal in a transistor. The circuit including the storage capacitor and the associated current-limiting device constitutes a voltage-generating network supplying operating current to the oscillator and its trigger amplifier regardless of the conductive or nonconductive state of the thyristor or equivalent electronic switch. Certain improvements in the design of this network are the subject matter of my copending applications Ser. Nos. 782,400 filed 29 Mar. 1977, 786,805 filed 12 Apr. 1977, (now U.S. Pat. No. 4,100,479) and 787,496 filed 14 Apr. 1977, whose disclosures are hereby incorporated by reference in the present application.

As further noted in some of my prior patents, the active component of the detector need not be an oscillator but could be an impedance bridge, a field plate or any of a variety of electromagnetic, photoelectric or other transducers responding to a predetermined change of an external condition to be monitored. Reference in this connection may also be made to U.S. Pat. No. 3,833,850.

A system of this description may be used either to intensify or to reduce the energization of a load upon detection of the event to be monitored. With the load constituted by an electromagnetic relay, for example, the latter may serve to open or to close an external circuit. Not infrequently, the same monitoring system must be employed first with one and then with the other mode of operation.

OBJECT OF THE INVENTION

The object of my present invention, thereof, is to provide simple means in such a system for selectively presetting it to respond to the change in ambient condition with either an increased or a decreased load current.

SUMMARY OF THE INVENTION

I realize this object pursuant to my present invention, by the insertion of logic circuitry, selectively activable to invert the binary signal issuing from the detector, in the output lead thereof for optionally closing and opening the thyristor or other electronic switch whenever that signal assumes a predetermine value.

According to a more specific feature of my invention, the selectively activable logic circuitry comprises an Exclusive-OR (XOR) gate -- of the ordinary or the negated type -- having a first input coupled to the output lead of the detector and a second input provided with a switchover means for alternatively applying two different voltages to that input, advantageously with the aid of a voltage divider connected in series with a circuit breaker across the supply leads emanating from the voltage-generating network. The circuit breaker could be a mechanical or an electronic switch operated either manually or under the control of an automatically generated reversing signal.

In order to prevent an untimely switchover in response to transient voltages, I prefer to connect a shunt capacitor in parallel with part of the voltage divider.

BRIEF DESCRIPTION OF THE DRAWING

My invention will now be described in detail with reference to the accompanying drawing in which.

SPECIFIC DESCRIPTION

Figure 1:
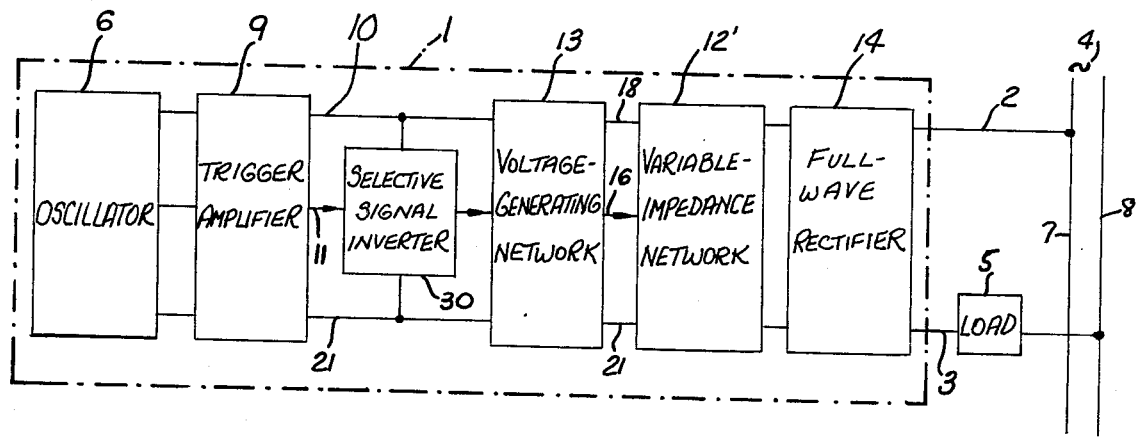
FIG. 1 is a block diagram of an electronic monitoring system provided with a selectively activable signal inverter according to my invention.

FIG. 1 shows the basic components of a monitoring system embodying my invention, namely an oscillator 6 and a trigger amplifier 9 together constituting a detector, a current-responsive load 5 such as a relay in a supply circuit whose two conductors 2, 3 are connected via respective bus bars 7, 8 across an a-c source 4, a full-wave rectifier 14 inserted between the supply conductors 2, 3 and a pair of leads 18, 21 extending to a variable-impedance network 12' whose impedance controls the load current in response to signals from oscillator 6, and a voltage-generating network 13 also receiving the output of rectifier 14 by way of leads 18 and 21. A selective signal inverter 30 is inserted in an output lead 11 of detector 6, 9 and is also connected to supply leads 10, 21 serving to energize the detector with direct current.

Figure 2:
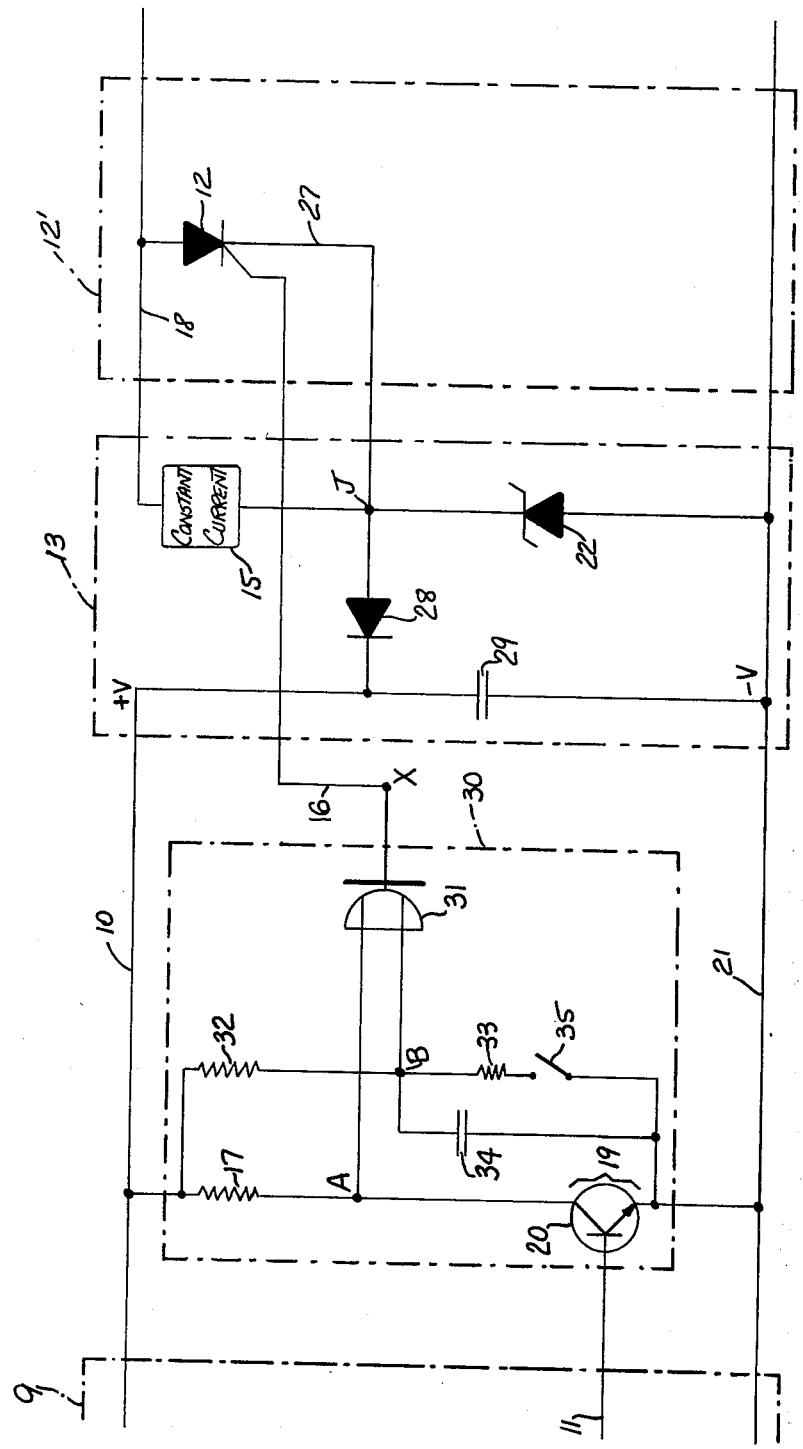
FIG. 2 is a more detailed circuit diagram of the signal inverter and associated components in the system of FIG. 1.

FIG. 2 shows details of the selective signal inverter 30 and adjoining components of the system of FIG. 1, i.e. voltage-generating network 13 and variable-impedance network 12'. The remaining components of the system may correspond, for example, to those of my prior U.S. Pat. No. 3,932,803. Network 12' also has the same configuration as in that prior patent, comprising a thyristor 12 whose anode is tied to positive supply lead 18 and whose cathode lead 27 is connected to the extension 10 of that supply lead via a decoupling diode 28. A storage capacitor 29, serving to smooth the pulsating half-cycles of the raw-rectified voltage from rectifier stage 14 (FIG. 1), is connected across conductors 10 and 11 in parallel with the series combination of rectifying diode 28 and a Zener diode 22; the junction J of these two diodes is connected to conductor 18 through a constant-current unit 15 which is thus shunted by the anode/cathode path of thyristor 12.

Circuit elements 15, 22, 28 and 29 are part of the voltage-generating network 13 which in my prior U.S. Pat. No. 3,932,803 also includes a resistor 17 connected in series with an NPN transistor 20 across leads 18 and 21. In the present instance, for convenience, resistor 17 and transistor 20 have been included in signal inverter 30, with resistor 17 tied to lead 10 in lieu of lead 18, yet the role of transistor 20 as an amplifying stage for the output signal of detector 6, 9 (FIG. 1) remains unchanged. Thus, output lead 11 of trigger amplifier 9 terminates at the base of transistor 20 whose collector/emitter resistance 19 is assumed to be small as long as oscillator 6 operates normally and becomes virtually infinite upon the approach of a metallic element, though the reverse mode of operation could also be used.

Transistor 20, when conducting, forms with resistor 17 a voltage divider having a tap A tied to one input of XOR gate 31 whose other input is connected to a tap B on a second voltage divider in parallel therewith, consisting of two series resistors 32 and 33. A circuit breaker 35 in series with that voltage divider, when opened, maintains the tap B substantially at the same potential +V (of logical value "1") as exists on tap A upon cutoff of transistor 20; with the ratio of resistors 32 and 33 approximately duplicating that of resistor 17 and collector/emitter resistance 19, these two taps are also at practically the same potential close to −V (of logical value "0") when transistor 20 conducts and circuit breaker 35 is closed. Circuit breaker 35 and the adjoining resistor 33 could be replaced by another transistor, similar to transistor 20, controlled by an external switchover signal.

XOR gate 31 has an output X tied to a gate lead 16 of thyristor 12 acting as a binary electronic switch. With gate 31 conducting, the thyristor is triggered on every half-cycle of the alternating voltage of source 4 (FIG. 1), or once per cycle if half-wave instead of full-wave rectification is used in unit 14. With a constant current drawn by device 15 to keep the capacitor 29 charged to the breakdown voltage of the Zener diode 22, the current through load 5 is significantly increased upon conduction of thyristor 12.

A shunt capacitor 34, connected across resistor 33 and circuit breaker 35, suppresses transient voltages which could otherwise interfere with the proper operation of XOR gate 31.

The truth table of such a XOR gate, as is well known, has the following form:

| A | B | X |
|---|---|---|
| 0 | 0 | 0 |
| 1 | 0 | 1 |
| 0 | 1 | 1 |
| 1 | 1 | 0 |

Thus, with circuit breaker 35 closed according to the first two lines of the foregoing truth table, the signal appearing at input A is transmitted to output X without inversion; with circuit breaker 35 open, as represented by the last two lines of the truth table, that signal is inverted.

Figure 3:
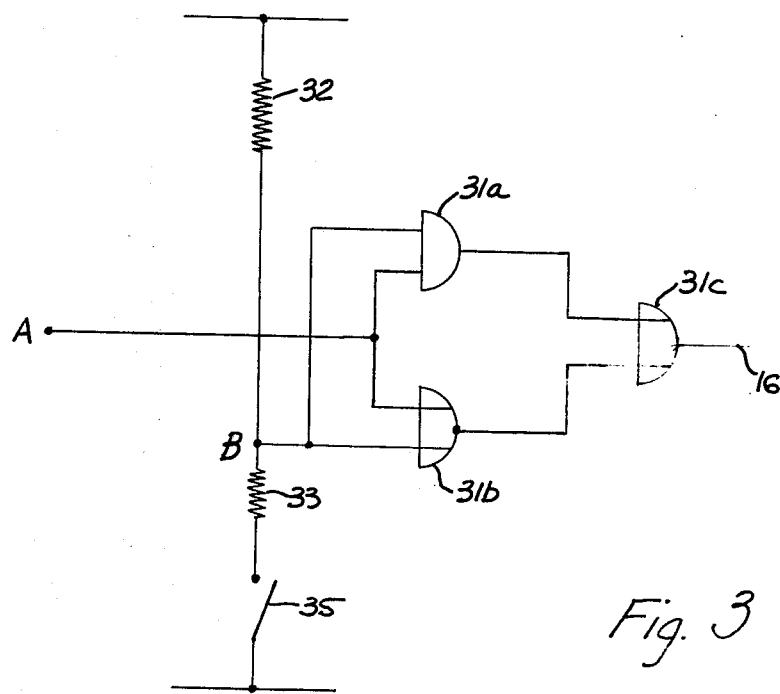
FIG. 3 shows details of a negated XOR gate adapted to be used in the signal inverter of FIG. 2.

In principle, of course, the XOR gate could also have a negated output, with interchange of the 0's and 1's in column X. Such a negated XOR gate has been shown in FIG. 3 as comprising an AND gate 31a and a NOR gate 31b with inputs connected in parallel to taps A and B, the outputs of these two gates being combined in an OR gate 31c feeding the lead 16.

Naturally, the system herein described may be modified in conformity with the teachings of the prior patents and copending applications referred to above.

I claim:

1. An electronic monitoring system comprising:
   detector means sensitive to an ambient condition for generating to an output lead a binary signal assuming a predetermined value in response to a significant change in said ambient condition, said detector means being provided with a pair of power-input terminals;
   a voltage-generating network provided with a pair of supply leads connected to said power-input terminals;
   a source of electrical energy connected across said network for delivering a direct current to said detector means via said supply leads;
   an electronic switch connected in shunt with at least part of said network across said source in series with a load, said switch being provided with a control input connected to said output lead; and
   logic circuitry in said output lead selectively activable to invert said binary signal for optionally closing and opening said electronic switch upon said binary signal assuming said predetermined value, said logic circuitry including an Exclusive-OR gate having a first input coupled to said output lead and a second input provided with switchover means for alternately applying thereto two different voltages available in said network.

2. A system as defined in claim 1 wherein said electronic switch comprises a thyristor with a gate electrode constituting said control input, said thyristor further having an anode and a cathode connected to receive a train of unipolar pulses from said source.

3. A system as defined in claim 1 wherein said switchover means comprises a voltage divider connected across said supply leads in series with said switchover means, said second input being tied to a tap of said voltage divider.

4. A system as defined in claim 3, further comprising transient-suppressing means connected to said second input.

5. A system as defined in claim 4 wherein said transient-suppressing means comprises a capacitor in parallel with part of said voltage divider.

* * * * *